(12) United States Patent
Yin et al.

(10) Patent No.: US 10,840,479 B2
(45) Date of Patent: Nov. 17, 2020

(54) OLED DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Xuebing Yin, Hubei (CN); Jing Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 188 days.

(21) Appl. No.: 16/092,464

(22) PCT Filed: Sep. 3, 2018

(86) PCT No.: PCT/CN2018/103739
§ 371 (c)(1),
(2) Date: Oct. 10, 2018

(87) PCT Pub. No.: WO2020/034265
PCT Pub. Date: Feb. 20, 2020

(65) Prior Publication Data
US 2020/0058903 A1    Feb. 20, 2020

(30) Foreign Application Priority Data
Aug. 15, 2018 (CN) .......................... 2018 1 0927690

(51) Int. Cl.
*H01L 51/52* (2006.01)
*H01L 27/32* (2006.01)

(52) U.S. Cl.
CPC ...... *H01L 51/5259* (2013.01); *H01L 27/3244* (2013.01); *H01L 51/5246* (2013.01)

(58) Field of Classification Search
CPC ............ H01L 51/5246; H01L 51/5259; H01L 27/3244
See application file for complete search history.

(56) References Cited

U.S. PATENT DOCUMENTS

2012/0133275 A1    5/2012  Lee et al.
2018/0033998 A1    2/2018  Kim et al.

FOREIGN PATENT DOCUMENTS

| CN | 105810710 A | 7/2016 |
| CN | 107507931 A | 12/2017 |
| CN | 107665950 A | 2/2018 |

*Primary Examiner* — Savitri Mulpuri
(74) *Attorney, Agent, or Firm* — Mark M. Friedman

(57) ABSTRACT

An OLED (organic light emitting diode) display panel is provided. The OLED display includes a substrate having a display region and a non-display region disposed around the display region, and the non-display region is provided with a partition wall. A first inorganic layer is disposed on the display region and the partition wall. A hydrophobic layer is disposed on the first inorganic layer and located corresponding to the partition wall. An organic layer is disposed on the first inorganic layer and a portion of the hydrophobic layer, wherein the organic layer is disposed on an inner side of the partition wall adjacent to the display region. A second inorganic layer is disposed on the organic layer.

17 Claims, 3 Drawing Sheets

OLED DISPLAY PANEL

BACKGROUND OF THE INVENTION

Field of Invention

The present invention relates to a field of display, and more particularly to a field of an OLED (organic light emitting diode) display panel.

Description of Prior Art

Organic materials used in OLED (organic light emitting diode) displays are highly susceptible to moisture and oxygen in the air whereby devices made of OLEDs may be easily to fail. Thus, OLED devices need to be packaged and require a moisture and oxygen permeability rate less than 10–6 g/m²d. The common traditional OLED packaging method is glass packaging; as the display technology is tending toward flexibility, the flexible display technology needs to apply a method of thin film packaging, and the basic structure of the thin film packaging is an inorganic/organic multilayer packaging form. The inorganic layer is usually deposited by means of PECVD (plasma enhanced chemical vapor deposition), etc., and the organic layer is mainly formed by inkjet printing (IJP). The function of the organic layer is planarizing and covering particles. In order to achieve a good leveling effect, ink with a lower viscosity is usually used for printing. Therefore, it is necessary to dispose a partition wall at the non-display region to determine the flowing boundary of the ink and prevent ink from overflowing from the display region to the non-display region. In order to effectively prevent the ink from overflowing, a plurality of partition walls is usually used.

However, use of a structure with two or three partition walls inevitably increases the distance of the cutting edge from the effective display region, and thus it is not conducive to carry out a narrow-framed display.

Therefore, the prior art has drawbacks, and thus it is urgent for improvement.

SUMMARY OF THE INVENTION

One objective of embodiments of the present invention is to provide an OLED (organic light emitting diode) organic display panel, which has beneficial effect of preventing ink from overflowing during printing.

An object of embodiments of the present invention is to provide an OLED display panel having the beneficial effect of preventing ink overflowing from printing.

In one embodiment of the present invention, the present invention provides an OLED display panel, which includes a substrate having a display region and a non-display region disposed around the display region, and the non-display region is provided with a partition wall; a first inorganic layer disposed on the display region and the partition wall; a hydrophobic layer disposed on the first inorganic layer and corresponding to the partition wall; an organic layer disposed on the first inorganic layer, wherein the organic layer is disposed on an inner side of the partition wall adjacent to the display region; and a second inorganic layer disposed on the organic layer; wherein the organic layer contacts with a portion of the hydrophobic layer, and the partition wall presents an annular structure.

In one embodiment of an OLED display panel of the present invention, the hydrophobic layer presents an annular structure, and a projection of the hydrophobic layer on the substrate covers a projection of the partition wall on the substrate.

In one embodiment of an OLED display panel of the present invention, the hydrophobic layer includes a first hydrophobic block disposed opposite to a second hydrophobic block and a third hydrophobic block disposed opposite to a fourth hydrophobic block, and the first hydrophobic block, the second hydrophobic block, the third hydrophobic block and the fourth hydrophobic block are interconnected to form the annular structure.

In one embodiment of an OLED display panel of the present invention, the first hydrophobic block, the second hydrophobic block, the third hydrophobic block and the fourth hydrophobic block each include a main body portion, a first end portion disposed on one side of the main body portion and a second end portion disposed on the other side of the main body portion, and the first end portion and the second end portion are both disposed on a surface of a side of the main body portion facing the partition wall.

In one embodiment of an OLED display panel of the present invention, an angle between the first end portion and the main body portion is 60 to 120 degrees, and an angle between the second end portion and the main body portion is 60 to 120 degrees.

In one embodiment of an OLED display panel of the present invention, the partition wall includes a first portion disposed opposite to a second portion, a third portion disposed opposite to a fourth portion, a first corner portion between the first portion and the third portion, a second corner portion between the first portion and the fourth portion, a third corner portion between the second portion and the third portion, and a fourth corner portion between the second portion and fourth portion; and the hydrophobic layer is disposed along the first corner portion, the second corner portion, the third corner portion, and the fourth corner portion.

In one embodiment of an OLED display panel of the present invention, the hydrophobic layer is further spaced at intervals along the first portion, the second portion, the third portion and the fourth portion.

In one embodiment of an OLED display panel of the present invention, material of the hydrophobic layer is polytetrafluoroethylene.

In further embodiment of the present invention, the present invention provides an OLED (organic light emitting diode) display panel, which includes a substrate having a display region and a non-display region disposed around the display region, and the non-display region is provided with a partition wall; a first inorganic layer disposed on the display region and the partition wall; a hydrophobic layer disposed on the first inorganic layer and corresponding to the partition wall; an organic layer disposed on the first inorganic layer, and the organic layer is disposed on an inner side of the partition wall adjacent to the display region; and a second inorganic layer disposed on the organic layer.

In one embodiment of an OLED display panel of the present invention, the organic layer contacts with a portion of the hydrophobic layer.

In one embodiment of an OLED display panel of the present invention, the partition wall presents an annular structure.

In one embodiment of an OLED display panel of the present invention, the hydrophobic layer presents an annular structure, and projection of the hydrophobic layer on the substrate covers projection of the partition wall on the substrate.

In one embodiment of an OLED display panel of the present invention, the hydrophobic layer includes a first hydrophobic block disposed opposite to a second hydrophobic block and a third hydrophobic block disposed opposite to a fourth hydrophobic block; and the first hydrophobic block, the second hydrophobic block, the third hydrophobic block and the fourth hydrophobic block are interconnected to form the annular structure.

In one embodiment of an OLED display panel of the present invention, the first hydrophobic block, the second hydrophobic block, the third hydrophobic block and the fourth hydrophobic block include a main body portion, a first end portion disposed on one side of the main body portion and a second end portion disposed on the other side of the main body portion, and the first end portion and the second end portion are both disposed on a surface of the main body portion facing a side of the partition wall.

In one embodiment of an OLED display panel of the present invention, an angle between the first end portion and the main body portion is 60 to 120 degrees, and an angle between the second end portion and the main body portion is 60 to 120 degrees.

In one embodiment of an OLED display panel of the present invention, the partition wall includes a first portion disposed opposite to a second portion, a third portion disposed opposite to a fourth portion, a first corner portion between the first portion and the third portion, a second corner portion between the first portion and the fourth portion, a third corner portion between the second portion and the third portion, and a fourth corner portion between the second portion and fourth portion; and the hydrophobic layer is disposed along the first corner portion, the second corner portion, the third corner portion, and the fourth corner portion.

In one embodiment of an OLED display panel of the present invention, the hydrophobic layer is further spaced at intervals along the first portion, the second portion, the third portion and the fourth portion.

In one embodiment of an OLED display panel of the present invention, material of the hydrophobic layer is polytetrafluoroethylene.

The OLED display panel of the present invention improves the ink leveling at edges thereof and prevents the ink from overflowing by disposing a hydrophobic layer on the first inorganic layer, which is located corresponding to the partition wall. The present invention is beneficial to carry out a narrow-framed display. Moreover, the hydrophobic layer can further prevent external moisture and oxygen from entering the display region through lateral of the partition wall, whereby it improves the boundary packaging effect.

BRIEF DESCRIPTION OF THE DRAWINGS

In order to more clearly illustrate technical solutions in the embodiments of the present invention, the drawings used in the description of the embodiments will be briefly described below. Obviously, the drawings in the following description are only some embodiments of the present invention. A person skilled in the art can also obtain other drawings without any creative efforts.

DETAILED DESCRIPTION OF THE PREFERRED EMBODIMENTS

Figure 1:
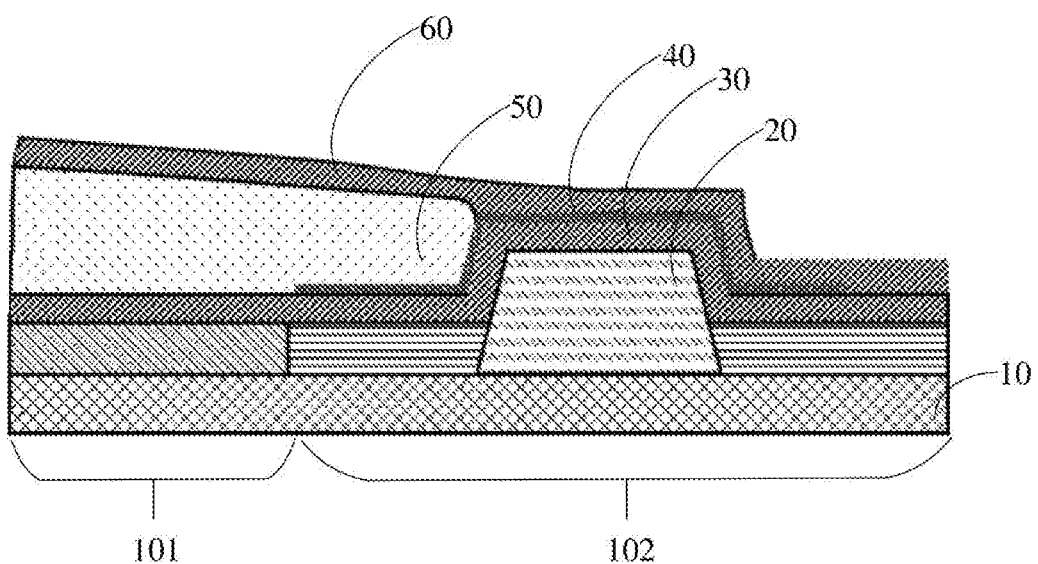
FIG. 1 is a schematic view of an OLED display panel according to an embodiment of the present invention.

The embodiments of the present invention are described in detail below, and the examples of the embodiments are illustrated in the drawings, in which the same or similar reference numerals indicate the same or similar elements or elements having the same or similar functions. The embodiments described below with reference to the drawings are used to understand the present invention, but are not to be as limiting.

In the description of the present invention, it is to be understood that the terms "center," "longitudinal," "lateral," "length," "width," "thickness," "upper," "lower," "front," "back," "left," "right," "vertical," "horizontal," "top," "bottom," "inside," "outside," "clockwise," "counterclockwise," etc., indicated as orientation or positional relationship are based on the orientation or positional relationship shown in the drawings, they merely intend to illustrate the present invention and simplify the description, but are not to be as indicating or implying specific devices or elements having specific orientation, specific orientation structure and operating. Therefore, it cannot be understood as limitations. Moreover, the terms "first" and "second" are merely used for describing purposes, but are not to be conceived as indicating or implying a relative important or implicitly indicating specific technical feature numbers. Accordingly, the feature limitations of "first" or "second" may include one or more of the described features explicitly or implicitly. In the description of the present invention, the meaning of "a plurality of" is two or more, unless otherwise explicitly defined.

In the description of the present invention, it should be noted that, unless otherwise explicitly defined, the terms "installation," "adjacent" and "connection" are to be understood broadly, for example, it may be fixed connection, disassembly connection or integral connection; it may be mechanical connection, electrically connection or interconnection; it may be directly connection or indirectly connected through an intermediate medium; and it may be interconnection of two elements or interaction of two elements. A person skilled in the art can conceive the specific meanings of the above-mentioned terms in the present invention based on the specific situation.

In the present invention, unless otherwise specifically defined and defined, the first feature is disposed "on" or "under" the second feature, which means that the first feature directly contacts the second feature, and also the first feature is not in direct contact the second feature but through addition features between them. Moreover, the first feature is disposed "above," "on" and "upper" the second feature, which means that the first feature is directly or substantially above the second feature, or merely indicates that the first feature level is higher than the second feature. The first feature is "below," "under" and "underneath" the second feature, which means that the first feature is directly or substantially below the second feature, or merely indicates that the first feature level is less than the second feature.

The following disclosure provides many different embodiments or examples for implementing different structures of the present invention. In order to simplify the disclosure of the present invention, the components and arrangements of the specific examples are described below.

Of course, they are merely examples and are not intended to limit the invention. In addition, the present invention may be repeated with reference numerals in the various examples, which are for the purpose of simplicity and clarity, and do not indicate the relationship between the various embodiments and/or arrangements discussed. Moreover, the present invention provides embodiments of various specific processes and materials, but a person skilled in the art may recognize the use of other processes and/or the use of other materials.

Referring to FIG. 1, it is a schematic view of an OLED display panel according to an embodiment of the present invention. As shown in FIG. 1, the OLED display panel includes a substrate 10; the substrate 10 includes a display region 101 and a non-display region 102 disposed around the display region 101; the non-display region 102 is provided with a partition wall 20. A first inorganic layer 30 is disposed on the display region 101 and the partition wall 20. A hydrophobic layer 40 is disposed on the first inorganic layer 30 and it corresponds to the partition wall 20. An organic layer 50 is disposed on the first inorganic layer 30 and a portion hydrophobic layer 40. The organic layer 50 is disposed on an inner side of the partition wall 20 adjacent to the display region 101. A second inorganic layer 60 is disposed on the organic layer 50, wherein the organic layer 50 contacts with a portion of the hydrophobic layer 40.

It should be noted that, the organic layer 50 is mainly formed by inkjet printing. In order to achieve a good leveling effect for the organic layer 50, one embodiment of the present invention disposes a partition wall 20 outside the display region 101 to ensure a leveling boundary of the ink, and a hydrophobic layer 40 is disposed on the first inorganic layer 30 and corresponds to the partition wall 20, thereby preventing the ink from overflowing the boundary of the partition wall 20 and ink sticking on the partition wall 20. In addition, since the embodiment of the present invention merely forms one partition wall 20 on the non-display region 102, the frame width of the OLED display panel is scaled down.

Figure 2:
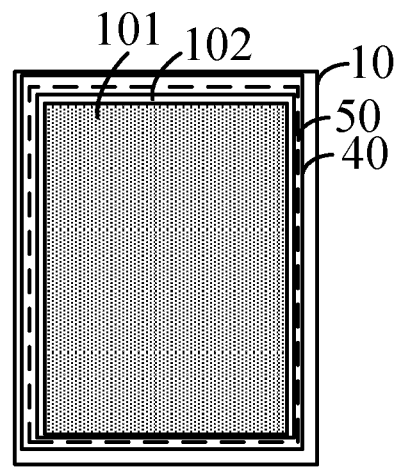
FIG. 2 is a schematic plan view of the OLED display panel according to the embodiment of the present invention.

Furthermore, referring to FIG. 1 and FIG. 2, FIG. 2 is a schematic plan view of the OLED display panel according to the embodiment of the present invention. As shown in FIG. 2, the partition wall 20 and the hydrophobic layer 40 are both presented as annular structures; that is, the partition wall 20 and the hydrophobic layer 40 are both disposed around the periphery of the display region 101, and a projection of the hydrophobic layer 40 on the substrate 10 covers a projection of the partition wall 20.

Figure 3:
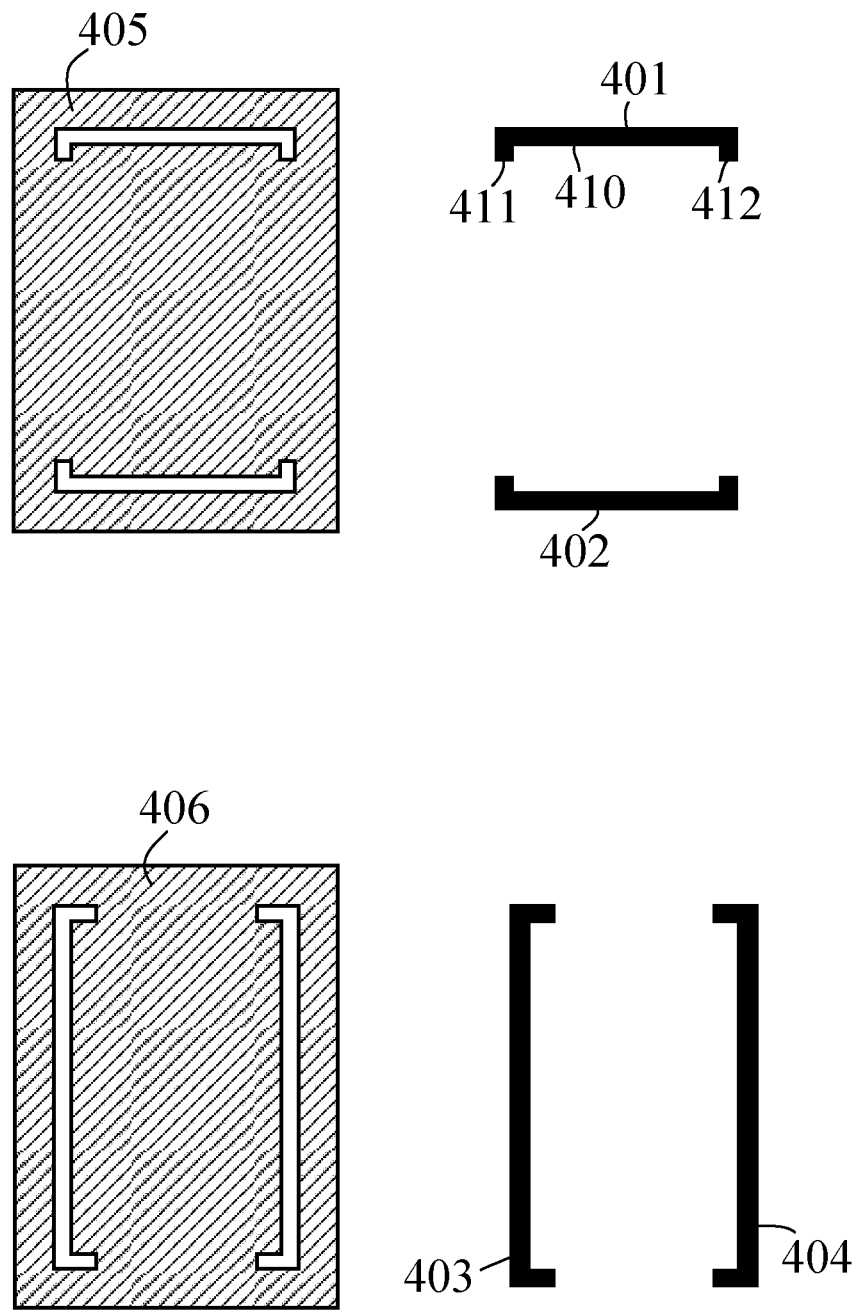
FIG. 3 is a schematic view showing formation of a hydrophobic layer of the OLED display panel according to the embodiment of the present invention.

Specifically, the hydrophobic layer 40 includes a first hydrophobic block 401 and a second hydrophobic block 402 located opposite to each other, and a third hydrophobic block 403 and a fourth hydrophobic block 404 located opposite to each other. The first hydrophobic block 401, the second hydrophobic block 402, the third hydrophobic block 403 and the fourth hydrophobic block 404 are interconnected to form an annular structure. In the embodiment, referring to FIG. 3, it is a schematic view showing formation of the hydrophobic layer 40 of the OLED display panel according to the embodiment of the present invention. As shown in FIG. 3, the first hydrophobic block 401 is formed opposite to the second hydrophobic block 402 through the first mask layer 405 on the non-display region 102 of the substrate, and the third hydrophobic block 403 is formed opposite to the fourth hydrophobic block 404 through the second mask layer 406 on the non-display region 102.

More specifically, the first hydrophobic block 401 includes a main body portion 410, a first end portion 411 disposed on one side of the main body portion 410 and a second end portion 412 disposed on the other side of the main body portion 410. The first end portion 411 and the second end portion 412 are both disposed on a surface of a side of the main body portion 410 facing the partition wall 20. Likewise, the second hydrophobic block 402, the third hydrophobic block 403 and the fourth hydrophobic block 404 each include a body portion, a first end portion on one side of the body portion, and a second end portion on the other side of the body portion, and the first end portion and the second end portion are both disposed on a surface of a side of the main body portion facing the partition wall.

In the embodiment, an angle between the first end portion 411 and the main body portion 410 is 60 to 120 degrees, and an angle between the second end portion 412 and the main body portion 410 is also 60 to 120 degrees. That is, in the embodiment of the present invention, due to a certain angel is formed between the first end portion 411 and main body portion 410 and a certain angel is formed between the second end portion 412 and the main body portion 410, the organic layer 50 is positioned in the middle of the annular structure formed by the first hydrophobic block 401, the second hydrophobic block 402, the third hydrophobic block 403 and the fourth hydrophobic block 404 interconnected to each other.

In the embodiment, material of the hydrophobic layer 40 is polytetrafluoroethylene.

Figure 4:
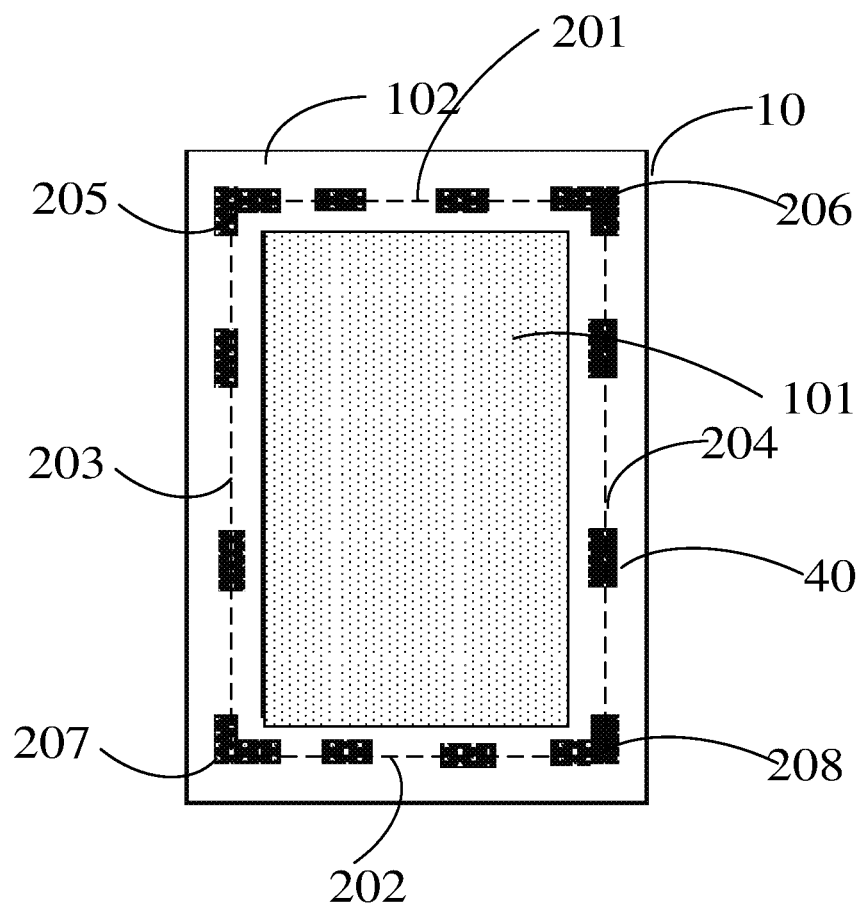
FIG. 4 is another schematic plan view of the OLED display panel according to the embodiment of the present invention.

Referring to FIG. 4, it is another schematic plan view of the OLED display panel according to the embodiment of the present invention. The difference between the OLED display panel shown in FIG. 4 and the OLED display panel shown in FIG. 2 is that the hydrophobic layer 40 in the OLED display panel shown in FIG. 4 is not presented as an annular structure, but it is disposed at some specific positions, and it also can prevent the ink from overflowing the boundary of the partition wall 20 and ink sticking on the partition wall 20.

As shown in FIG. 1 and FIG. 4, the partition wall 20 includes a first portion 201 and a second portion 202 located opposite to each other, a third portion 203 and a fourth portion 204 located opposite to each other, a first corner portion 205 disposed between the first portion 201 and a third portion 203, a second corner portion 206 disposed between the first portion 201 and the fourth portion 204, a third corner portion 207 disposed between the second portion 202 and the third portion 203, and a fourth corner portion 208 disposed between the second portion 202 and the fourth portion 204.

More specifically, the hydrophobic layer 40 is disposed along the first corner portion 205, the second corner portion 206, the third corner portion 207 and the fourth portion 208. That is, the embodiment of the present invention merely provides a hydrophobic layer 40, such as the first corner portion 205, the second corner portion 206, the third corner portion 207 and the fourth portion 208, disposed opposite to the partition wall.

Furthermore, the hydrophobic layer 40 is spaced at intervals along the first portion 201, the second portion 202, the third portion 203 and fourth portion 204.

The OLED display panel of the present invention improves the ink leveling at edges of the ink and prevents the ink from overflowing by disposing a hydrophobic layer on the first inorganic layer, and the hydrophobic layer is located corresponding to the partition wall, whereby the present invention is beneficial to carry out a narrow-framed display. Moreover, the hydrophobic layer can further prevent external moisture and oxygen from entering the display region through laterals of the partition wall, and thereby to improve the boundary packaging effect.

The OLED display panel and the OLED display device provided by the embodiments of the present invention is described in detail. The principles and embodiments of the present invention are described in detail herein. The description of the above-mentioned embodiments is merely for helping to understand the present invention. Simultaneously, a person skilled in the art can modify the description and application field based on the content of the present invention. Accordingly, the present invention is not deemed as being limited by the content of the specification.

What is claimed is:

1. An OLED display panel comprising:
a substrate, wherein the substrate comprises a display region and a non-display region disposed around the display region, and the non-display region is provided with a partition wall;
a first inorganic layer disposed on the display region and the partition wall;
a hydrophobic layer disposed on the first inorganic layer and corresponding to the partition wall;
an organic layer disposed on the first inorganic layer, and the organic layer is disposed on an inner side of the partition wall adjacent to the display region; and
a second inorganic layer disposed on the organic layer;
wherein the organic layer contacts with a portion of the hydrophobic layer, and the partition wall presents an annular structure.

2. The OLED display panel of claim 1, wherein the hydrophobic layer presents an annular structure, and projection of the hydrophobic layer on the substrate covers projection of the partition wall on the substrate.

3. The OLED display panel of claim 2, wherein the hydrophobic layer comprises a first hydrophobic block disposed opposite to a second hydrophobic block and a third hydrophobic block disposed opposite to a fourth hydrophobic block; and the first hydrophobic block, the second hydrophobic block, the third hydrophobic block and the fourth hydrophobic block are interconnected to form the annular structure.

4. The OLED display panel of claim 3, wherein the first hydrophobic block, the second hydrophobic block, the third hydrophobic block and the fourth hydrophobic block comprise a main body portion, a first end portion disposed on one side of the main body portion and a second end portion disposed on the other side of the main body portion, and the first end portion and the second end portion are both disposed on a surface of the main body portion facing a side of the partition wall.

5. The OLED display panel of claim 4, wherein an angle between the first end portion and the main body portion is 60 to 120 degrees, and an angle between the second end portion and the main body portion is 60 to 120 degrees.

6. The OLED display panel of claim 1, wherein the partition wall comprises a first portion disposed opposite to a second portion, a third portion disposed opposite to a fourth portion, a first corner portion between the first portion and the third portion, a second corner portion between the first portion and the fourth portion, a third corner portion between the second portion and the third portion, and a fourth corner portion between the second portion and fourth portion; and the hydrophobic layer is disposed along the first corner portion, the second corner portion, the third corner portion and the fourth corner portion.

7. The OLED display panel of claim 6, wherein the hydrophobic layer is further spaced at intervals along the first portion, the second portion, the third portion and the fourth portion.

8. The OLED display panel of claim 7, wherein material of the hydrophobic layer is polytetrafluoroethylene.

9. An OLED display panel comprising:
a substrate, wherein the substrate comprises a display region and a non-display region disposed around the display region, and the non-display region is provided with a partition wall;
a first inorganic layer disposed on the display region and the partition wall;
a hydrophobic layer disposed on the first inorganic layer and corresponding to the partition wall;
an organic layer disposed on the first inorganic layer, wherein the organic layer contacts with a portion of the hydrophobic layer, and the organic layer is disposed on an inner side of the partition wall adjacent to the display region; and
a second inorganic layer disposed on the organic layer.

10. The OLED display panel of claim 9, wherein the partition wall presents an annular structure.

11. The OLED display panel of claim 10, wherein the hydrophobic layer presents an annular structure, and projection of the hydrophobic layer on the substrate covers projection of the partition wall on the substrate.

12. The OLED display panel of claim 11, wherein the hydrophobic layer comprises a first hydrophobic block disposed opposite to a second hydrophobic block and a third hydrophobic block disposed opposite to a fourth hydrophobic block disposed; and the first hydrophobic block, the second hydrophobic block, the third hydrophobic block and the fourth hydrophobic block are interconnected to form the annular structure.

13. The OLED display panel of claim 12, wherein the first hydrophobic block, the second hydrophobic block, the third hydrophobic block and the fourth hydrophobic block comprise a main body portion, a first end portion disposed on one side of the main body portion and a second end portion disposed on the other side of the main body portion, and the first end portion and the second end portion are both disposed on a surface of the main body portion facing a side of the partition wall.

14. The OLED display panel of claim 13, wherein an angle between the first end portion and the main body portion is 60 to 120 degrees, and an angle between the second end portion and the main body portion is 60 to 120 degrees.

15. The OLED display panel of claim 10, wherein the partition wall comprises a first portion disposed opposite to a second portion, a third portion disposed opposite to a fourth portion, a first corner portion between the first portion and the third portion, a second corner portion between the first portion and the fourth portion, a third corner portion between the second portion and the third portion, and a fourth corner portion between the second portion and fourth portion; and the hydrophobic layer is disposed along the first corner portion, the second corner portion, the third corner portion, and the fourth corner portion.

16. The OLED display panel of claim 15, wherein the hydrophobic layer is further spaced at intervals along the first portion, the second portion, the third portion and the fourth portion.

17. The OLED display panel of claim 16, wherein material of the hydrophobic layer is polytetrafluoroethylene.

\* \* \* \* \*